United States Patent [19]

Rudolf

[11] Patent Number: 4,680,544
[45] Date of Patent: Jul. 14, 1987

[54] TORSION TYPE MAGNETIC FIELD MEASUREMENT DEVICE

[75] Inventor: Felix Rudolf, Cortaillod, Switzerland

[73] Assignee: Centre Electronique Horloger SA, Switzerland

[21] Appl. No.: 586,815

[22] Filed: Mar. 6, 1984

[30] Foreign Application Priority Data

Mar. 7, 1983 [FR] France .................................. 83 03692

[51] Int. Cl.⁴ ............................................. G01R 33/02
[52] U.S. Cl. .................................................... 324/259
[58] Field of Search ............... 324/244, 256, 257, 258, 324/259, 260, 261, 224, 226

[56] References Cited

U.S. PATENT DOCUMENTS 4,483,194 11/1984 Rudolf ............................... 73/517 R

FOREIGN PATENT DOCUMENTS 1279091 6/1972 United Kingdom ................ 324/256

Primary Examiner—Ernest F. Karlsen
Assistant Examiner—Walter E. Snow
Attorney, Agent, or Firm—Parkhurst & Oliff

[57] ABSTRACT

A device sensitive to a magnetic field (B) comprising a flap attached to a support by torsion hinges and a conductor. The conductor carries a current I and thus generates under the effect of a magnetic field a force which tends to cause the flap to turn about its hinge axis. The measurement of this rotation or of the compensation required to nullify the effect of the magnetic field (B) constitutes a measure of this magnetic field. Embodiments are disclosed having multi-turn conductors or ferromagnetic coatings instead of conductors on the flaps.

16 Claims, 10 Drawing Figures

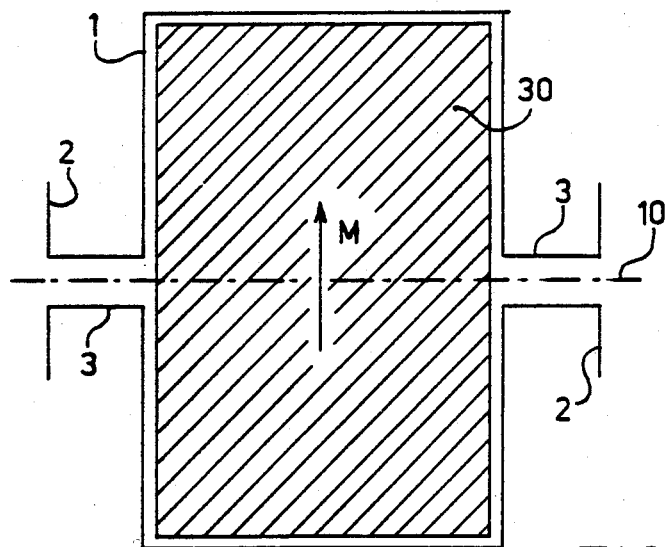
FIG.3
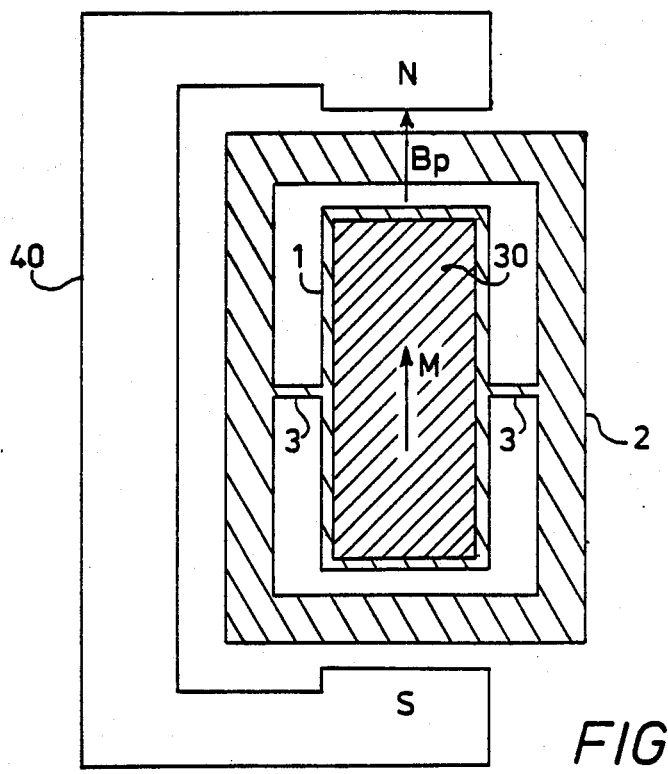
FIG.4.a

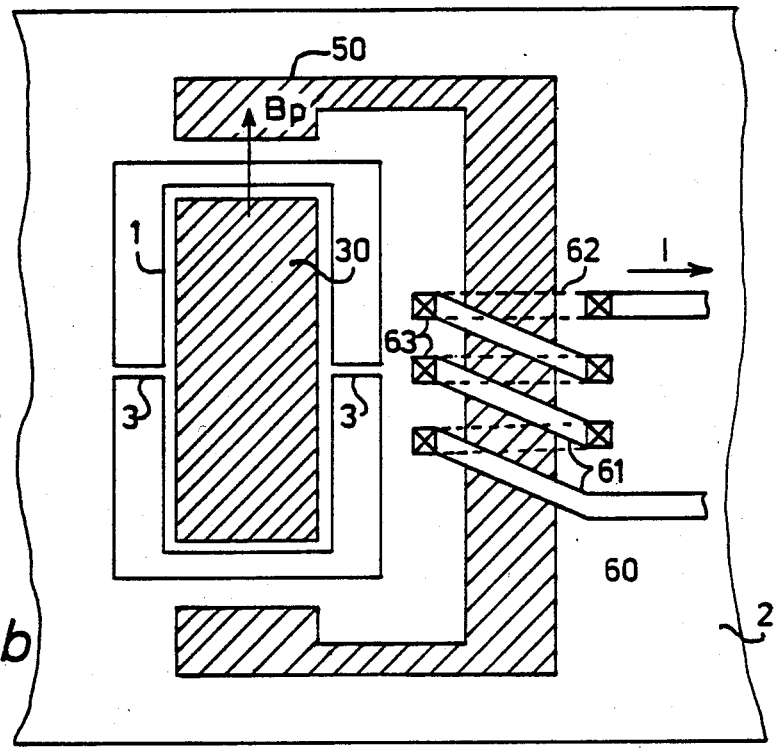
FIG.4.b
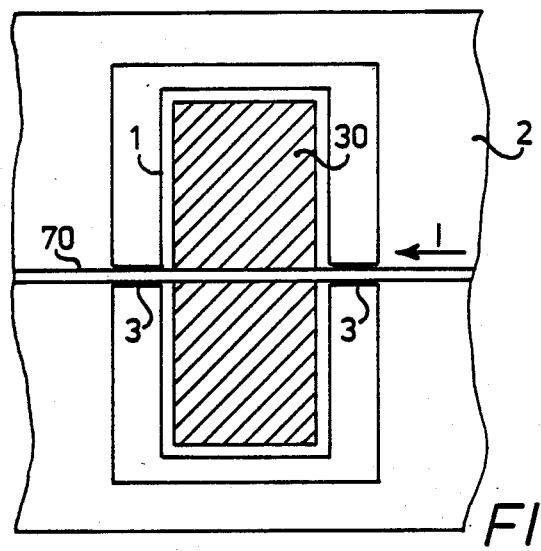
FIG.4.c

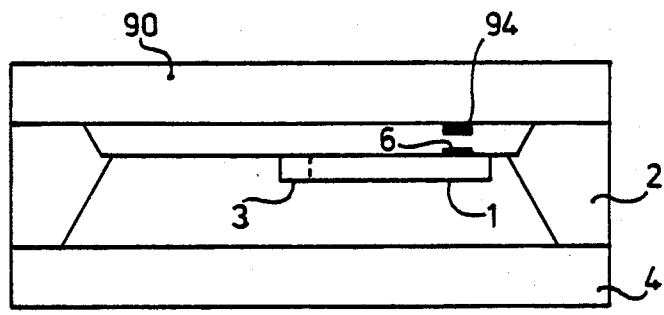
FIG.6.a
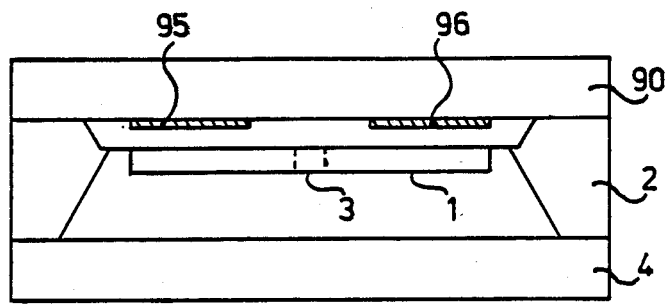
FIG.6.b
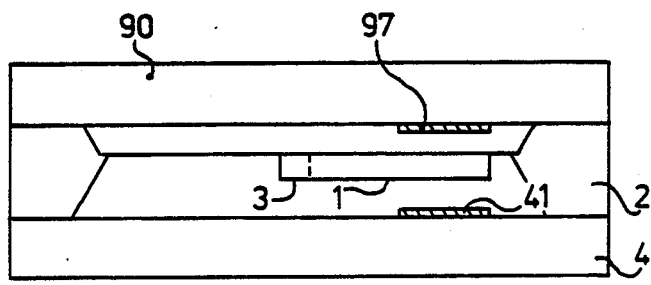
FIG.6.c

TORSION TYPE MAGNETIC FIELD MEASUREMENT DEVICE

BACKGROUND OF THE INVENTION

The present invention relates to a miniature magneticfield-sensitive device and a magnetic field measuring instrument incorporating such a device.

Measurement of magnetic field strength takes place in areas as varied as navigation, the measurement of strong currents, determination of the relative position of two objects, etc. Some integrated transducers are known, the most common of which is the Hall effect transducer. Significant work has also been done on sensitive electronic devices such as magneto-diodes and magneto-transistors. The sensitivity of these transducers remains rather low, however, and varies from about 0.75 volts per tesla for a Hall effect transducer having an integrated amplification circuit to 10 volts per tesla for a magneto-transistor. Moreover, the parameters of these known sensitive electronic devices are significantly affected by variations in temperature.

SUMMARY OF THE INVENTION

The present invention provides a magnetic field measuring instrument which includes a magnetic-field-sensitive flap device and means for delivering a signal representing the force generated on the flap by a magnetic field.

The magnetic-field-sensitive flap device comprises a flap attached to a support by torsion hinges and a conductor. The torsion hinges comprise ligaments or other forms of attachment which permit the flap to turn about its hinge axis with the consequent generation of a torsional restoring torque. The conductor may be constituted by a magnetic stripe carrying an electric current. The conductor generates, under the effect of a magnetic field, a force which tends to cause the flap to turn about its hinge axis. Alternatively, the conductor may be constituted by a ferromagnetic coating whose direction of magnetization is located in the plane of the flap and perpendicular to its hinge axis.

The means for delivering a signal may act by compensating the effect of the magnetic field to be measured on the flap so that it is always maintained in its rest position.

The device of the invention offers the advantages of great sensitivity, low cost mass production capabilities due to integrated circuit technology and great stability with respect to temperature changes.

Accordingly, an object of the invention is to provide a miniature magnetic-field sensitive device not having the abovementioned disadvantages.

Another object of the present invention is to provide a miniature magnetic-field-sensitive device which remains unaffected by variations in temperature and which can be produced in accordance with integrated circuit technology.

A further object of the present invention is to provide a magnetic field measuring instrument that incorporates the miniature magnetic-field-sensitive device.

BRIEF DESCRIPTION OF THE DRAWINGS

The invention will be described in more detail, by way of example, with reference to the accompanying drawings, in which:

FIG. 3 is a diagrammatic view of a third magnetic-field-sensitive device embodying the invention;

FIG. 4a shows a first method of polarizing the ferromagnetic coating of the flap in FIG. 3;

FIG. 4b shows a second method of polarizing the ferromagnetic coating of the flap in Fig.3;

FIG. 4c shows a third method of polarizing the ferromagnetic coating of the flap in FIG. 3;

FIGS. 6a, 6b and 6c show different ways of achieving compensation of the effect of the magnetic field on the flap.

DETAILED DESCRIPTION OF THE INVENTION

Figure 1:
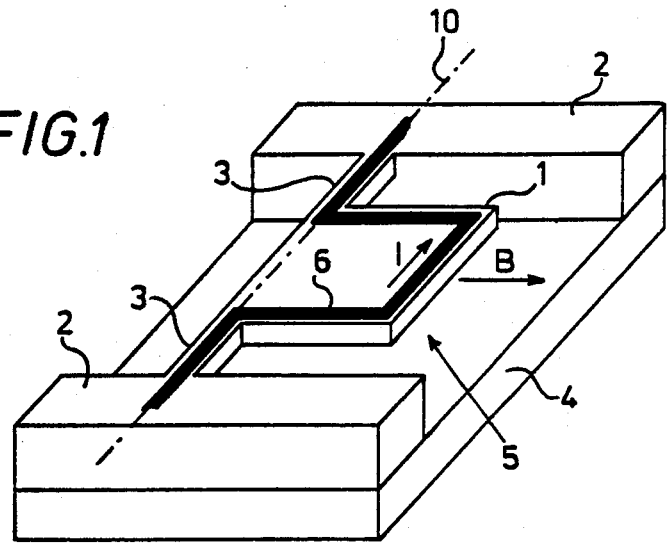
FIG. 1 is a diagrammatic view of a first magnetic-field-sensitive device embodying the invention.

The present invention will now be described in more detail with reference to the accompanying drawings. In FIG. 1, a magnetic field sensitive device includes a flap 1 of approximately rectangular form, attached to a support 2 by first and second torsion hinges 3. The hinges 3 form, with one side of the flap 1, an axis of rotation 10 about which the flap 1 can turn. A torsional restoring torque is generated by the torsion hinges 3 when the flap 1 turns. The support 2 may be disposed on a base 4 with which it forms a cavity 5. The cavity 5 may also be formed in the support 2 itself by constructing the support 2 and the base 4 as an integral component. According to the device shown in FIG. 1, a conductive stripe 6 is provided on the flap 1 so that when a current I passes through the stripe 6, and the device is placed in a magnetic field B, a force F perpendicular both to the direction of the magnetic field B and to the direction of the current is exerted on the flap 1. If b and c are the length and width respectively of the flap 1, the mechanical moment to which the flap is subjected is equal to $M_m = b \cdot c \cdot I \times B$ (the sign "·" indicating a scaler product and the sign "x" indicating a vector product). Under the action of this mechanical moment, the flap turns about its hinges 3 until the restoring torque exerted by the hinges 3 balances the moment produced by the combined action of the current I and the magnetic field B. The angle through which the flap 1 turns is a measure of the component of the magnetic field perpendicular to the direction of the current I. Since the force exerted on the flap depends solely on the magnetic field B, the current I through the stripe 6 and the geometry of the flap, the device is very accurate and stable.

The device represented by FIG. 1 can be produced by procedures similar to integrated circuit technology procedures. For example, the support 2 can be made from a substrate of n-type silicon. The flap 1 and its hinges 3 are made from the same substrate and are doped with a p-type dopant. The base or plate 4 can be glass which is fixed to the support 2 by means of anodic bonding. The following dimensions can be easily produced:

Area of the flap: $500 \times 500 \ \mu m^2$

Geometry of the hinges: $1.3 \times 5 \times 100 \ \mu m^3$

The structure of the flap 1 affords a favorable ratio of force of inertia over restoring force. Also, the restoring force of the hinges 3 can be reduced by decreasing the section of the hinges 3 while still maintaining a firm attachment of the flap 1 to the support 2. A reduction in the restoring force of the hinges 3 advantageously increases the sensitivity of the device. Another advantage of such a structure is that it allows rotation of the flap 1 about its hinge axis 10, but prevents any movement involving a lengthening of either hinge 3. This guarantees an accurate performance of the device for measuring the magnetic field B in the direction in the plane of the flap 1 and perpendicular to its axis of rotation 10 which is the preferred direction. This advantage can be further increased if the support 2 is composed of monocrystalline silicone and if the flap 1 and its hinges 3 are heavily doped with boron (with a typical concentration greater than or equal to $10^{19}$ atoms/cm$^3$). Doping with boron creates longitudinal constraints on the hinges 3 of the flap 1, which prevents the flap from moving in other than the preferred direction.

Figure 2:
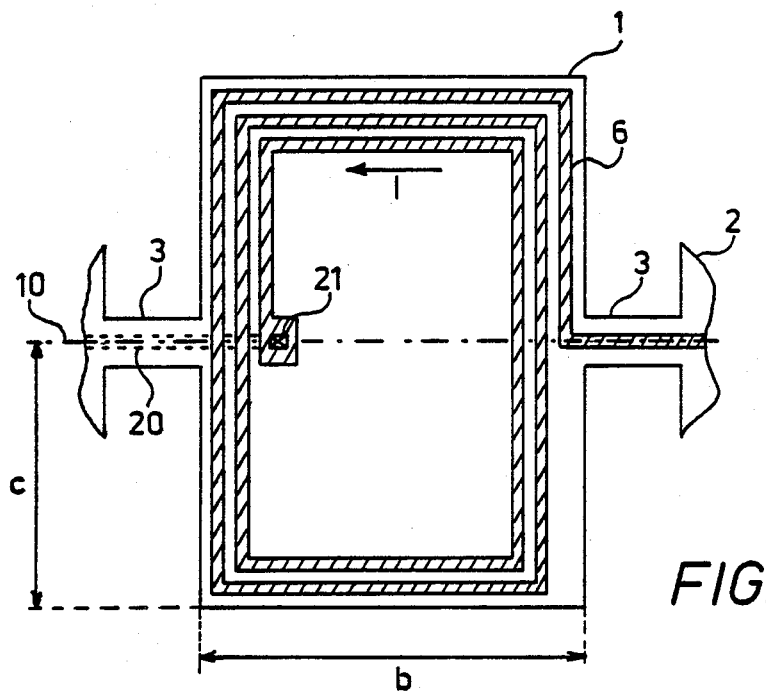
FIG. 2 is a diagrammatic view of second magnetic-field-sensitive device embodying the invention.

FIG. 2 depicts another embodiment of the device of the invention. According to this embodiment, the conductive stripe 6 has a plurality of turns (two and a half turns in the case of FIG. 2) on the flap 1. The flap 1 of FIG. 2 has a symmetrical shape with respect to its axis of rotation 10. The symmetrical shape of the flap 1, in addition to the increase in the number of turns of the conductive stripe 6, results in the advantage of an increase in the sensitivity of the device. An additional advantage of a symmetrical flap over an asymmetrical flap, as in FIG. 1, is that it eliminates the acceleration effect perpendicular to the plane of the flap. Any acceleration perpendicular to the plane of an asymmetrical flap exerts a force that tends to make it turn, whereas the effects produced on each part of a symmetrical flap tend to cancel each other out.

The mechanical moment $M_m$ produced by a magnetic field B on a flap of length b and c comprising n turns through which a current I flows, is $M_m = 2 n \cdot b \cdot c \cdot I \times B$. A diffusion zone 20 which is electrically connected to the conductive stripe 6 by means of a contact window 21 permits the current in the coil to be supplied by a current source situated outside the flap. To reduce the length of the connections, the two outputs of the coil can be produced on the same side of the flap. The conductive stripe 6 may be produced by deposit and etching a coating of aluminum or of any other suitable material on the stripe 6.

FIG. 3 depicts yet another embodiment of the device of the invention. According to this version, the flap 1 is covered with a thin coating 30 of a ferromagnetic material. This coating is magnetized in the plane of the flap 1 and in a direction perpendicular to the axis of rotation 10 of the flap, as indicated by the arrow M on the flap 1. As in the case of the device of FIG. 2, the flap is symmetrical with respect to its axis of rotation 10. Although not essential, this form is preferred when, as has been seen hereinbefore, it is desired to increase the sensitivity of the device or eliminate the effects due to acceleration of the flap.

Alloys of iron and nickel can be used as the ferromagnetic coating. A coating on the order of 100 nanometers can be deposited on the flap 1 by evaporation. In view of the weak coercive field of this material, the deposited coating 30 must be polarized by an external field. The magnetization M of the coating remains essentially in the plane of the flap, even for fields perpendicular to the plane of the flap which are much greater than the polarization field, which enables this device to be used for the detection and measurement of high magnetic fields. The mechanical moment $M_m$ exterted on the flap by a magnetic field B is: $M_m = V \cdot M \times B$, where V is the volume of the ferromagnetic coating, M is the magnetization of this coating and B is the magnetic field to be measured.

FIGS. 4a and 4b depict different methods for creating the field for polarizing the deposited coating in the plane of the flap 1. With respect to FIG. 4a, the magnetization M of the deposited coating 30 is produced by an external biasing or polarizing magnet 40, which may be of the permanent magnet type, as shown, or of the electromagnet type. The device of the invention is placed in the air gap of the external magnet 40 so that the flux $B_p$ created by the magnet produces the magnetization M of the coating 30 in the plane of the flap 1 and perpendicular to its axis of rotation.

FIG. 4b depicts how to integrate an electromagnet, designed to create a polarization flux $B_p$ for the coating 30 deposited on the flap 1, on the support 2 of the device of the invention. The magnetic circuit of the electromagnet is obtained by deposition of a ferromagnetic coating 50, of the same nature as that of the flap 1, on the support 2. An energizing coil 50 is formed of parallel aluminum conductive bands 61 which are interconnected by diffusion zones 62 that are situated underneath the ferromagnetic coating 50. Contact windows 63 provide an electrical connection between the conductive bands 61 and the diffusion zones 62. Supply of the coil 60 with a current I creates a polarization flux $B_p$ which magnetizes the ferromagnetic coating 30 on the flap 1.

FIG. 4c shows another method of magnetizing the coating deposited on the flap 1. According to this version, a conductive stripe 70 composed, for example, of aluminum traverses the middle of flap 1. When a current I passes through this conductive stripe 70, the stripe produces a field which polarizes the coating 30 in the plane of the flap 1 and perpendicular to its axis of rotation. This method is identical to that described in connection with the specifications on pages 21-2 and 21-3 of the manual "Handbook of Thin Film Technology," published in 1970 by McGraw-Hill Book Company. As in the case of FIG. 4b, several turns can likewise be produced around the coating 30 of the flap 1.

The various devices described above can be used in a magnetic field measuring instrument which delivers an electrical quantity proportional to the force produced on the flap by the magnetic field to be measured.

Figure 5:
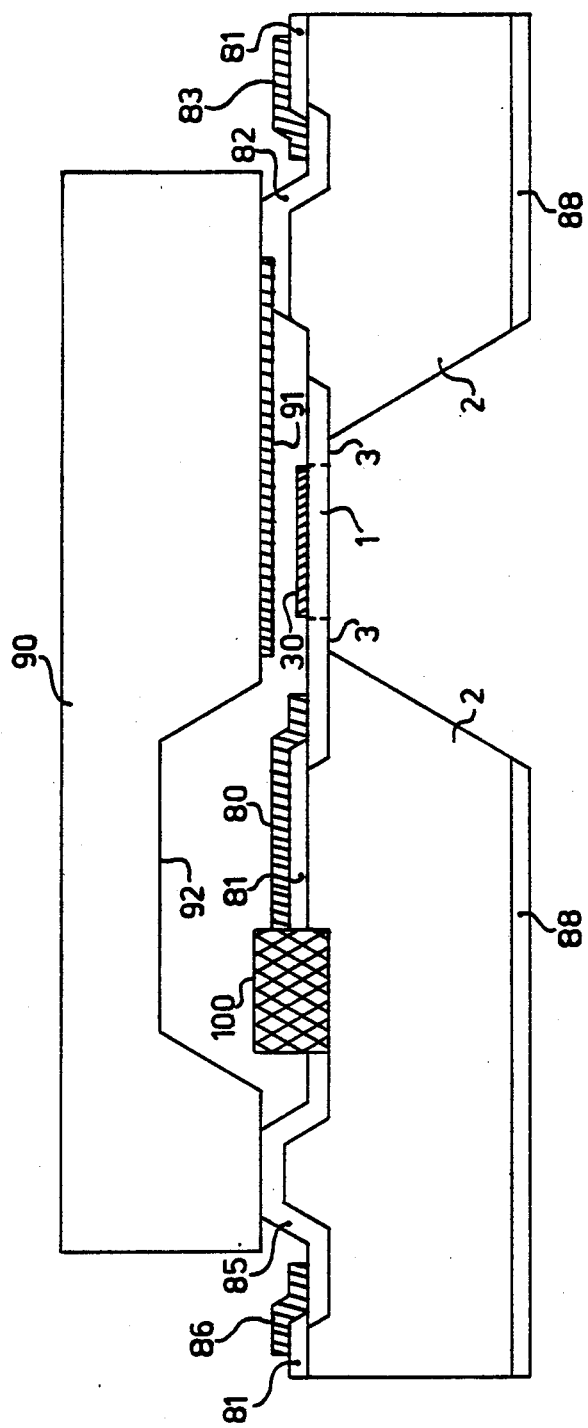
FIG. 5 is a view in section of a measuring instrument incorporating the magnetic-field-sensitive device embodying the present invention.

FIG. 5 is a view in section of such a measuring instrument along the axis of rotation of the flap 1. The flap 1 is fixed by torsion hinges 3 to a support 2. The flap 1 and the support 2 are formed from a substrate of slightly doped n-type silicon. The flap 1 bears a ferromagnetic coating 30 (or coil depending upon the embodiment employed). The flap 1 is constituted of doped silicon (for example p+) and can therefore be electrically connected to a circuit 100 integrated on the support 2 by means of a conductive coating 80. This circuit 100 is adapted to measure the capacitance of a variable capacitor formed by the flap 1 on the one hand and a fixed counter-electrode 91 on the other hand. This counter-electrode 91 is deposited on a plate 90 which may be glass and which is fixed to the support 2 by the so-called anodic bonding technique. A recess 92 is provided in the plate 90 opposite the measuring circuit 100. FIG. 5 also shows a diffused zone 82 which effects the electric connection between the counter-electrode 91 and an aluminum connection 83, and a diffused zone 85 which effects the electric connection between the measuring circuit 100 and an aluminum connection 86. Apart from the points of contact with the diffused zones, the aluminum connections such as 80, 83 and 86 are produced on an insulating coating 81 of $SiO_2$. Likewise, the bottom surface of the support 2 can be protected by a coating 88 of $SiO_2$.

By way of example, the process of producing the instrument of FIG. 5 comprises the following main steps:

- etching of the silicon to form the gap between the flap 1 and its counter-electrode 91;
- integration of the measuring circuit 100 and production of the coil at the site of the flap (alternatively deposit and etching of the ferromagnetic coating);
- chemical etching of the silicon from the back by anisotropic attacks and attacks selective to the type of doping of the silicon (for example, anodic attack or anodic passivation);
- cutting out of the flap 1 by the wet method or by plasma etching;
- deposit and etching of the aluminum on the glass plate 90 to form the counter-electrode;
- fixing of the glass plate 90 to the silicon support 2 by anodic bonding.

The principle of the measuring instrument according to the invention is as follows. The flap when provided with a coil through which a current flows (FIGS. 1 and 2) or covered with a polarized ferromagnetic coating (FIGS. 3 and 4) constitutes a sensitive device which turns, in the presence of a magnetic field perpendicular to its plane, through an angle proportional to the applied field. In the instrument of FIG. 5, the rotation of the flap 1 is measured by measuring the corresponding variation in the capacitance of the capacitor formed by the flap 1 on the one hand and the counter-electrode 91 on the other hand. This measurement of the variation in capacitance is well known and an example thereof can be found in the applicants' British Patent Application No. 2,101,336A corresponding to U.S. Pat. No. 4,483,194.

In order to prevent the flap 1 from touching the counter-electrodes 91, it is possible to produce stop studs of insulating material on the flap 1 or on the plate 90 bearing the counter-electrode. In the case of a device with a flap of symmetrical shape, it is possible to provide two counter-electrodes, each of them being disposed opposite one of the two parts of the flap located on opposite sides of its axis of rotation. The two counter-electrodes and the correpsonding parts of the flap then form two capacitors whose variations of capacitance are measured to obtain the value of the magnetic field.

In the measuring instrument described above, the gap between the flap 1 and counter-electrode 91 must be rather small (of the order of 2 μm) for the capacitance between the two elements to have a measurable value. This condition involves a limitation of the possible rotation of the flap 1 and, as a consequence, a limitation of the range of the measurable values of the magnetic field. Such limitations may be removed by providing a compensating circuit, the purpose of which is to produce on the flap 1 a force exactly opposite to that created by the magnetic field to be measured, so that the flap 1 is always maintained in its rest position. The compensating circuit is preferably controlled by an electrical quantity whose value will be a direct measure of the magnetic field to be measured. FIGS. 6a to 6c show three different methods of compensation. In these three Figures, the flap 1 is shown in a section perpendicular to its axis of rotation; it is fixed to the support 2 by its hinges 3 and the support 2 is fixed to a base 4 as in FIG. 1. A plate 90 is likewise fixed to the support 2 and has the same function as in FIG. 5.

FIG. 6a shows an asymmetrical flap 1 provided with a conductive stripe 6 through which a current flows, as shown in FIG. 1. The effect of the magnetic field to be measured can be compensated by creating another magnetic field of the same intensity, but of opposite direction, for example, by producing a conductive stripe 94 on the plate 90 and opposite the conductive band 6. The passage of a current through this conductive stripe 94 will create at the level of the conductive band 6 of the flap 1 a field proportional to the current. It is then possible to compensate exactly the effect of the magnetic field to be measured and to measure this magnetic field by measuring the current necessary for this compensation. It is quite obvious that the conductive stripe 94 may form a plurality of turns as is the case for the conductive stripe 6.

FIGS. 6b and 6c show another way of compensating the force produced on the flap 1 by the magnetic field to be measured. Here the compensation is effected by creating an electric field between the flap 1 and an electrode, whose effect will be to compensate exactly the mechanical torque exerted on the flap 1 by the magnetic field to be measured. This type of compensation is particularly applicable when the flap 1 is provided with a ferromagnetic coating. The flap 1 can be rendered conductive by suitable doping and it is therefore possible to create a force of attraction with the aid of an electric field. Thus, in the case of a flap 1 of symmetrical shape (FIG. 6b), two electrodes 95 and 96 are provided on the plate 90 and, according to the direction of the magnetic field to be measured, one or the other will be able to create a force of attraction capable of compensating the effect of the magnetic field to be measured. According to FIG. 6c, the two electrodes 97 and 41 are situated on both sides of the flap 1 which has an asymmetrical shape. The voltage necessary to be applied between the flap 1 and one of the electrodes to compensate exactly the effect of the magnetic field to be measured is a measure of this magnetic field.

Although the present invention has been described within the compass of particular embodiments, it is nevertheless clear that it is not limited to these embodiments and that it is open to modifications or variations without departing from the scope of the claims. In particular, it is quite obvious that materials other than those described may be used and that other methods of measuring the force exerted on the flap can be employed. Thus, it is conceivable to supply the coil on the flap with an alternating current or again to excite mechanical resonance of the flap to increase the sensitivity of the device.

What is claimed is:

1. A miniature magnetic-field sensitive device comprising a flap; a support; first and second torsion hinges on opposite sides of said flap to attach said flap to said support and defining a hinge axis of rotation for said flap; a ferromagnetic coating on said flap and magnetized in a direction perpendicular to said axis; and means on said support for creating a polarization field in the plane of said flap and perpendicular to its hinge axis of rotation, said polarization field magnetizing the ferromagnetic coating.

2. A device according to claim 1, wherein the flap has a symmetrical shape with respect to its hinge axis.

3. A device according to claim 1 wherein the means for creating a polarization field comprise at least one conductive stripe for carrying an electric current, said conductive stripe being disposed on the ferromagnetic coating of the flap so as to magnetize the coating in the plane of the flap and perpendicular to its hinge axis.

4. A device according to claim 3 wherein the conductive stripe forms a plurality of turns.

5. A magnetic field measuring instrument including a magnetic-field-sensitive device according to claim 3 and first means for delivering a signal representing the force generated on the flap by an external magnetic field, wherein said first means comprises:
(a) a conductive stripe situated on a fixed plate opposite the flap; and
(b) means for passing through the conductive stripe a current such that the magnetic field produced compensates the effect of the external magnetic field to be measured, the value of said current constituting a measure of the magnetic field to be measured.

6. A magnetic field measuring instrument including a magnetic-field-sensitive device according to claim 3 and first means for delivering a signal representing the force generated on the flap by a magnetic field, wherein said first means comprise:
(a) at least one electrode which is disposed opposite the flap substantially parallel to its rest position, said electrode constituting a first capacitor plate;
(b) second means forming a second capacitor plate on the flap; and
(c) a circuit connected to the first and second capacitor plates for measuring the variation in the capacitance of the capacitor.

7. A device according to claim 1 wherein the means for creating a polarization field comprise:
(a) a second ferromagnetic coating, said ferromagnetic coating being deposited on the support forming a magnetic circuit with the ferromagnetic coating of the flap; and
(b) at least one conductive turn for carrying an electric current, said conductive turn linking the second ferromagnetic coating to the ferromagnetic coating of the flap, said second ferromagnetic coating creating a polarization field in the ferromagnetic coating of the flap.

8. A magnetic field measuring instrument including a magnetic-field-sensitive device according to claim 7 and first means for delivering a signal representing the force generated on the flap by an external magnetic field, wherein said first means comprise:
(a) a conductive strip situated on a fixed plate opposite the flap; and
(b) means for passing through the conductive strip a current such that the magnetic field produced compensates the effect of the external magnetic field to be measured, the value of said current constituting a measure of the magnetic field to be measured.

9. A magnetic field measuring instrument including a magnetic-field-sensitive device according to claim 7 and first means for delivering a signal representing the force generated on the flap by a magnetic field, wherein said first means comprise:
(a) at least one electrode which is disposed opposite the flap substantially parallel to its rest position, said electrode constituting a first capacitor plate;
(b) second means forming a second capacitor plate on the flap; and
(c) a circuit connected to the first and second capacitor plates for measuring the variation in the capacitance of the capacitor.

10. A magnetic field measuring instrument including a magnetic-field-sensitive device according to claim 1 and first means for delivering a signal representing the force generated on the flap by a magnetic field, wherein said first means comprises:
(a) at least one electrode which is disposed opposite the flap substantially parallel to its rest position, said electrode constituting a first capacitor plate;
(b) second means forming a second capacitor plate on the flap; and
(c) a circuit connected to the first and second capacitor plates for measuring the variation in the capacitance of the capacitor.

11. A measuring instrument according to claim 10, wherein the device is implemented in a silicon substrate and the flap is doped in such manner as to constitute the second capacitor plate.

12. A measuring instrument according to claim 10, wherein the device is implemented in a silicon substrate and the measuring circuit is integrated on the silicon substrate.

13. A magnetic field measuring instrument including a magnetic-field-sensitive device according to claim 1 and first means for delivering a signal representing the force generated on the flap an external magnetic field, wherein the first means comprise:
(a) a conductive stripe situated on a fixed plate oposite the flap; and
(b) means for passing through the conductive stripe a current such that the magnetic field produced compensates the effect of the external magnetic field to be measured, the value of said current constituting a measure of the magnetic field to be measured.

14. A magnetic field measuring instrument including a magnetic-field-sensitive device according to claim 1 and first means for delivering a signal representing the force generated on the flap by a magnetic field wherein the first means comprise at least one first electrode provided on said flap and at least one second electrode fixed relative to said support and means for applying between said at least one first and second electrodes a voltage such that the electric field produced by this voltage generates on the flap a force which compensates the effect of the magnetic field to be measured, the value of the applied voltage constituting a measure of the magnetic field to be measured.

15. A measuring instrument according to claim 14, wherein the flap has a symmetrical shape with respect to its hinge axis of rotation and wherein said at least one second electrode comprises two electrodes disposed on a plate fixed to the support and opposite the ends of the flap.

16. A measuring instrument according to claim 14 wherein said at least one second electrode comprises two electrodes located on opposite sides of the flap.

* * * * *